US009244505B2

(12) United States Patent
Yu et al.

(10) Patent No.: US 9,244,505 B2
(45) Date of Patent: Jan. 26, 2016

(54) PORTABLE ELECTRONIC DEVICE WITH EXPOSED HEAT DISSIPATING MECHANISM

(71) Applicant: CHAUN-CHOUNG TECHNOLOGY CORP., New Taipei (TW)

(72) Inventors: Chia-Hsing Yu, New Taipei (TW); Ming-Chih Wu, New Taipei (TW)

(73) Assignee: CHAUN-CHOUNG TECHNOLOGY CORP., New Taipei (TW)

( * ) Notice: Subject to any disclaimer, the term of this patent is extended or adjusted under 35 U.S.C. 154(b) by 156 days.

(21) Appl. No.: 14/184,776

(22) Filed: Feb. 20, 2014

(65) Prior Publication Data

US 2014/0347811 A1   Nov. 27, 2014

(30) Foreign Application Priority Data

May 23, 2013   (TW) .............................. 102118261 A

(51) Int. Cl.
*H05K 7/20*   (2006.01)
*G06F 1/20*   (2006.01)

(52) U.S. Cl.
CPC ............ *G06F 1/203* (2013.01); *H05K 7/20154* (2013.01); *H05K 7/20336* (2013.01); *H05K 7/20409* (2013.01)

(58) Field of Classification Search
CPC .......... H05K 7/20154; H05K 7/20336; H05K 7/20409; G06F 1/20
See application file for complete search history.

(56) References Cited

U.S. PATENT DOCUMENTS

| | | | | |
|---|---|---|---|---|
| 5,132,874 A * | 7/1992 | Chandler | ................ | H05K 7/20 219/210 |
| 5,430,609 A * | 7/1995 | Kikinis | ................... | G06F 1/203 361/679.09 |
| 6,234,240 B1 * | 5/2001 | Cheon | .................... | F28D 15/00 165/185 |
| 6,469,892 B2 * | 10/2002 | Ueda | ........................ | G06F 1/20 165/104.33 |
| 6,507,493 B2 * | 1/2003 | Ueda | ....................... | G06F 1/203 165/185 |
| 7,625,223 B1 * | 12/2009 | Fogg | ................... | H05K 5/0247 361/715 |
| 8,050,028 B2 * | 11/2011 | Merz | ................ | G02F 1/133308 165/104.21 |
| 2006/0133043 A1 * | 6/2006 | Boudreaux | ............ | H05K 1/144 361/704 |
| 2008/0212285 A1 * | 9/2008 | Sun | .......................... | G06F 1/20 361/710 |
| 2011/0038120 A1 * | 2/2011 | Merz | ................. | G02F 1/133308 361/679.47 |

* cited by examiner

*Primary Examiner* — Gregory Thompson
(74) *Attorney, Agent, or Firm* — Chun-Ming Shih; HDLS IPR Services

(57) ABSTRACT

A portable electronic device with an exposed heat dissipating mechanism includes a housing and a heat dissipating plate. A heat generating unit is arranged inside the housing, and the heat dissipating plate includes a main body arranged inside the housing and at least one cooling portion extended from the main body and exposed on the housing. The main body and the heat generating unit are thermally connected to each other. Therefore, the effectiveness of the heat dissipation can be enhanced without increasing the thickness of the device and such that the need for heat dissipation in a portable electronic device of higher performance and computing power can be satisfied.

14 Claims, 4 Drawing Sheets

PORTABLE ELECTRONIC DEVICE WITH EXPOSED HEAT DISSIPATING MECHANISM

BACKGROUND OF THE INVENTION

1. Field of the Invention

The present invention is related to a portable electronic device, in particular, to a portable electronic device with an exposed heat dissipating mechanism 2. Description of Related Art Portable electronic devices, including such as mobile phone, personal digital assistant (PDA), electronic reader and tablet computer, are developed to have greater performance with smaller sizes and thicknesses. As their performances advance with higher processing power, the heat generated by such portable devices also increases rapidly; in addition, due to the accumulation of the heat generated, the temperature at the internal environment of the portable electronic devices could increase to certain extend. As the time of usage of the device increases, the internal heat transferred out via the housing to the external of the device could even be felt by the user; furthermore, the continuous usages of the device along with the accumulation of heat without satisfactory cooling could result in poor performance of the device including such as slower operational speed and operational shutdown; in a worst case scenario, the useful lifetime of the electronic device could be reduced or even cause damages on internal components of the device due to great heat accumulation at the internal of the device. Nevertheless, it is known that the thickness of the device also influences the cooling, and as the portable electronic device becomes thinner in size, the cooling for such thin electronic device becomes even more difficult. Therefore, there is a need for an effective and powerful heat dissipating or cooling mechanism for current portable electronic devices of higher performances and smaller in sizes.

Currently, a known portable electronic device is equipped with a metal sheet and the metal sheet is thermally connected to the heat generating unit inside the housing in order to conduct the heat generated to the housing via the metal sheet such that the heat can be further dissipated to the external environment. This is known to be one of the basic solutions of heat dissipation for a known electronic device.

However, for a portable electronic device with much greater computing power and performance, such basic heat dissipating mechanism is found to be insufficient to handle the heat generated by such powerful portable electronic device; in addition, due to the limitation on the thickness of the portable electronic device, it is not possible to include the design or construction of a heat sink or dissipating fan inside the portable electronic device. In view of the above, the inventor of the present invention seeks to provide a design capable of enhancing the effect of heat dissipation without increasing the thickness of a portable electronic device, as a technical problem to be overcome by the present invention.

SUMMARY OF THE INVENTION

An objective of the present invention is to provide a portable electronic device with an exposed heat dissipating mechanism, capable of using cooling portions provided on a main body of a heat dissipating plate and exposed on the housing in order to effectively dissipate the heat generated by the heat generating unit and conducted to the main body via the cooling portions; therefore, the effectiveness of the heat dissipation can be enhanced without increasing the thickness of the device and such that the present invention is able to satisfy the needs for heat dissipation in a portable electronic device of higher performance and computing power.

To achieve the aforementioned objective, the present invention provides a portable electronic device with an exposed heat dissipating mechanism, comprising: a housing having a heat generating unit arranged therein; and a heat dissipating plate comprising a main body provided at the internal of the housing and at least one cooling portion extended from the main body and exposed on the housing; wherein the main body and the heat generating unit are thermally connected to each other.

In comparison to the prior arts, the present invention includes at least the following merits: the present invention is able to utilize the cooling portions extended from the main body to the outer of the housing in order to transfer heat to the external environment directly such that the present invention is able to achieve effective dissipation of heat without increasing the thickness of the portable electronic device, which also advantageously allows the present invention to be widely applicable to a variety of portable electronic devices with increasingly higher performance and demanding greater heat dissipation within confined sizes. Furthermore, the present invention is able to ensure that the temperature inside the portable electronic device is well maintained at a suitable range with effective heat dissipation such that the device is protected from poor performance or machine breakdown in addition to that the electronic components of the device can also be saved from having shorter useful lives or damages due to the accumulation of internal heat generated.

DETAILED DESCRIPTION OF THE INVENTION

The following provides detailed description of embodiments of the present invention along with the accompanied drawings. It can, however, be understood that the accompanied drawings are provided for illustrative purposes only and shall not be treated as limitations to the present invention.

Figure 1:
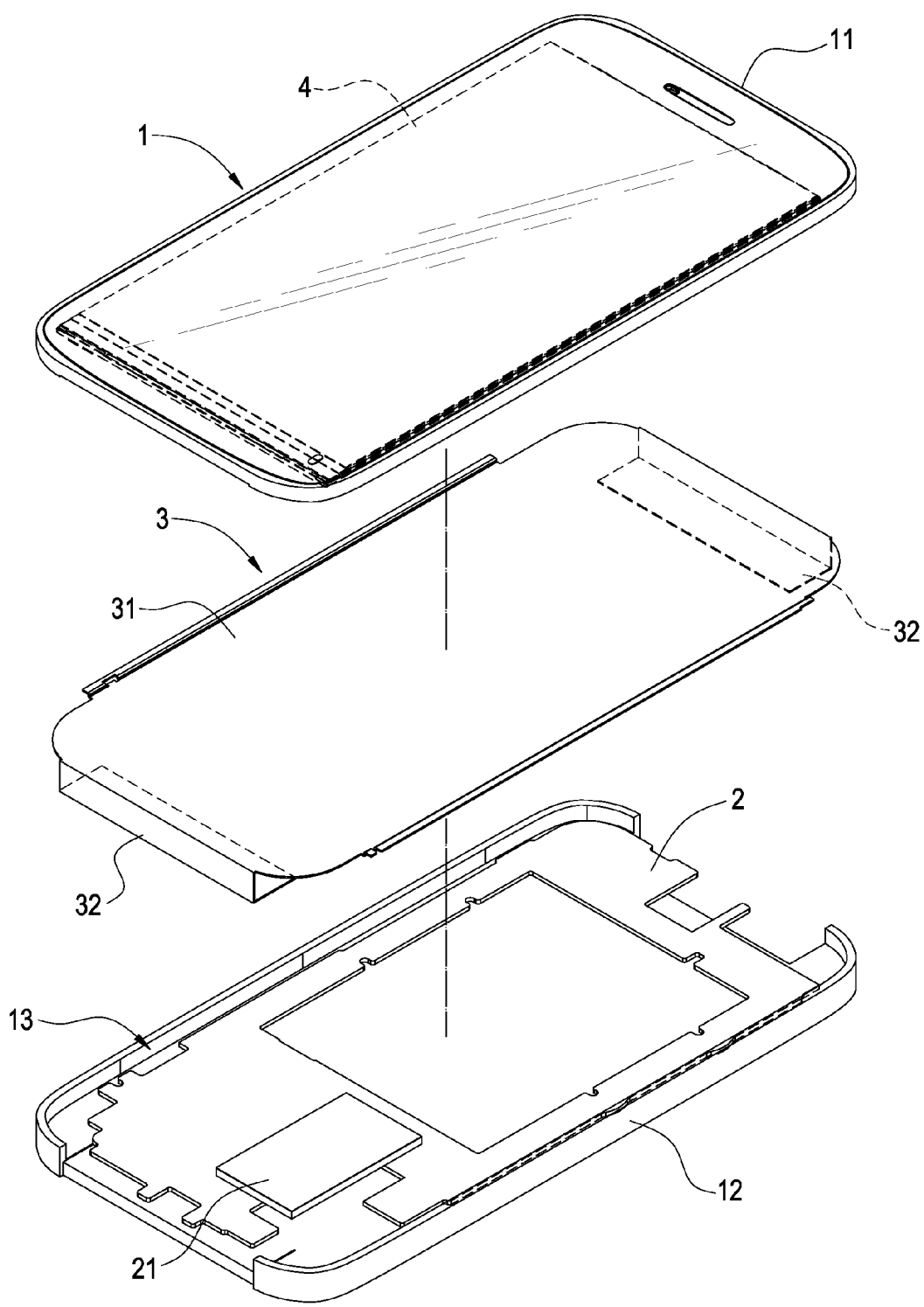
FIG. 1 is an exploded view of the present invention.

The present invention provides a portable electronic device with an exposed heat dissipating mechanism; wherein the portable electronic device can be a mobile phone, a personal digital assistant (PDA), an electronic reader or a tablet computer. As shown in FIG. 1, the portable electronic device of the present invention comprises: a housing 1, a circuit board 2 and a heat dissipating plate 3.

Figure 2:
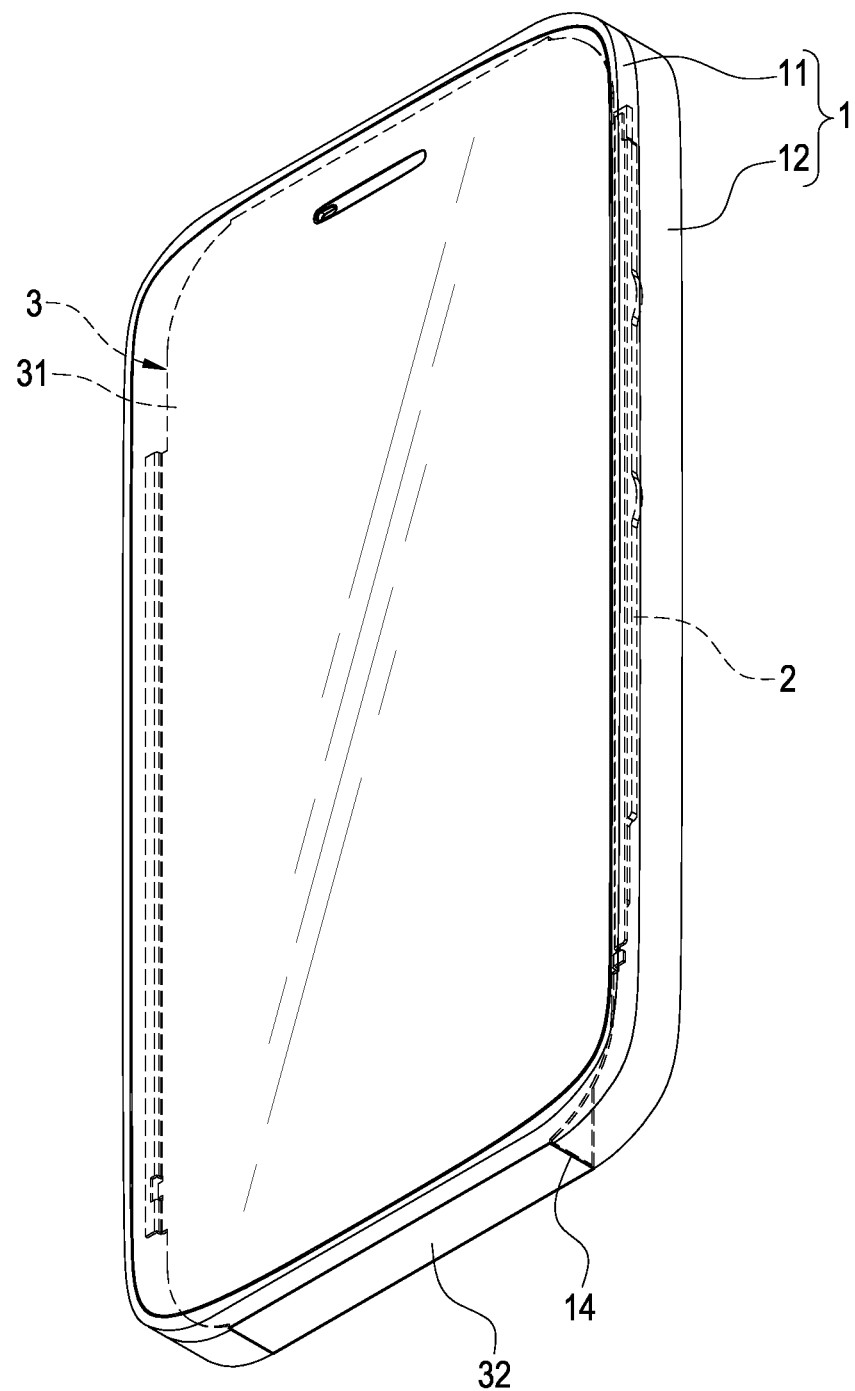
FIG. 2 is a front view showing an assembly of the present invention.
Figure 3:
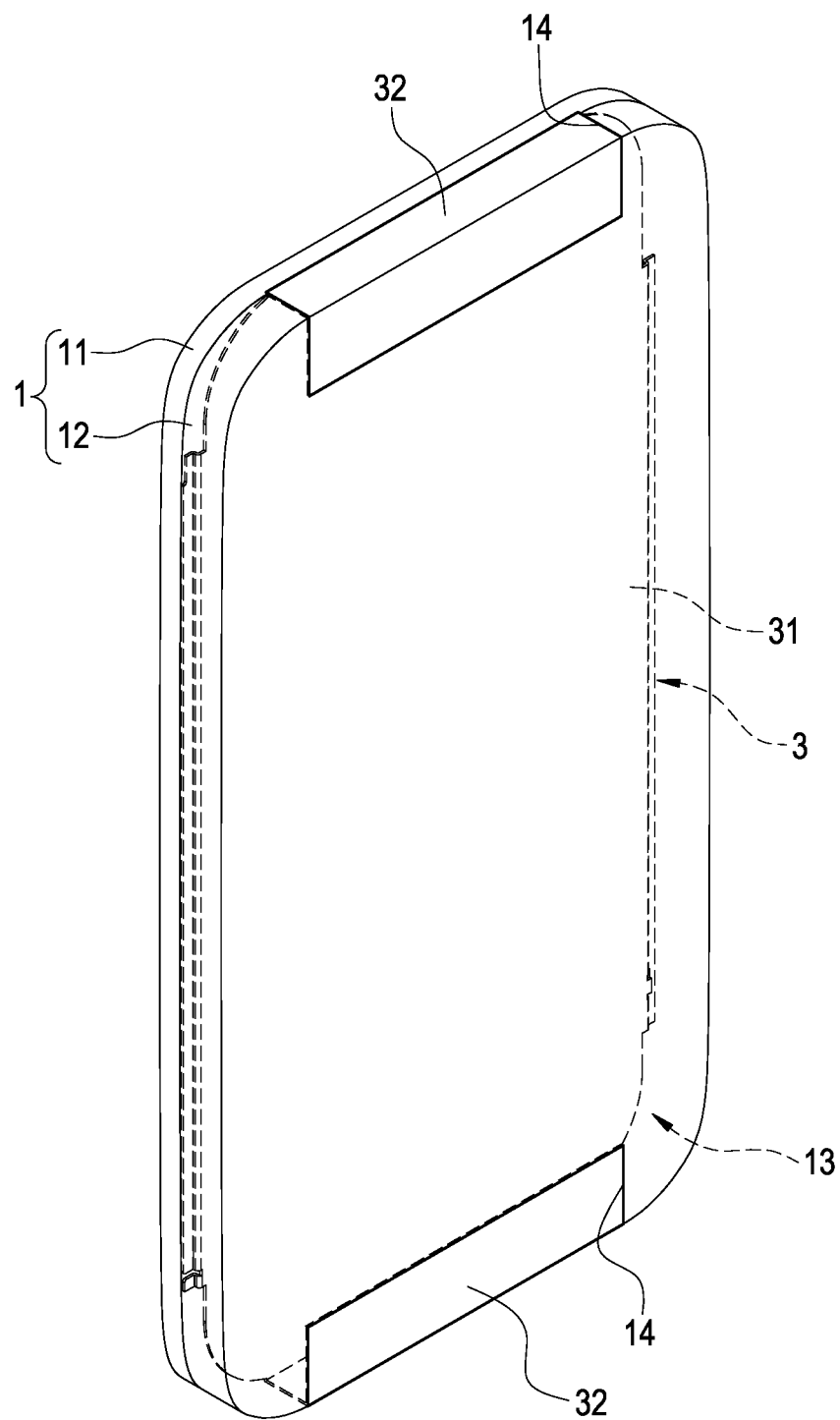
FIG. 3 is a rear view showing an assembly of the present invention.

As shown in FIGS. 1~3, the housing 1 comprises an upper housing member 11 and a lower housing member 12. The upper housing member 11 and the lower housing member 12 can be attached to each other, and the assembled upper and lower housing members 11, 12 include a receiving space 13 formed therebetween. As shown in FIG. 1, the inner wall of the upper housing member 11 further includes a display device 4 provided therein. A shown in both FIG. 1 and FIG. 3, the housing 1 includes at least one cut-out portion 14 formed thereon; in this exemplary embodiment, two of such cut-out portions 14 are shown for illustration. It can be understood that there may be a plurality of cut-out portions 14 formed thereon; for example, there may be four cut-out portions 14

(only two are shown in the figure) formed on the housing 1, and the present invention is not limited to any number of the cut-out portions formed. The cut-out portions 14 can be formed on one side of the housing 1, such as either one of the upper side or lower side of the housing as shown in FIG. 3; alternatively, they may too be formed on two sides of the housing 1, such as both the upper side and the lower side of the housing 1; likewise, they may too be formed on all four sides (not shown in the figure) of the housing 1. The cut-out portions 14 are not limited to any particular shapes or forms but as long as they are of shapes and forms capable of allowing the cooling portions 32 to be exposed to the outer therefrom; in addition, the cut-out portions 14 shown to be opening through holes in the figure are configured in such shape and form for illustrative purpose only and the present invention is not limited to such shape and form only.

The circuit board 2 is provided inside the receiving space 13, and the heat generating unit 21 is electrically connected to the circuit board 2. The quantity of the heat generating unit is not limited to any particular number in the present invention; according to one embodiment of the present invention, one single heat generating unit 21, as shown in FIG. 1, is used for the illustration of the present invention. In fact, there may be more than one heat dissipating units and the present invention is able to achieve the heat dissipation for a plurality of heat dissipating units. Furthermore, the heat dissipating unit can be a chip 21, as shown in the figure, or it may be a rechargeable battery (not shown in the figure) electrically connected to the circuit board 2; generally, the present invention is not limited to any type of heat dissipating unit.

Figure 4:
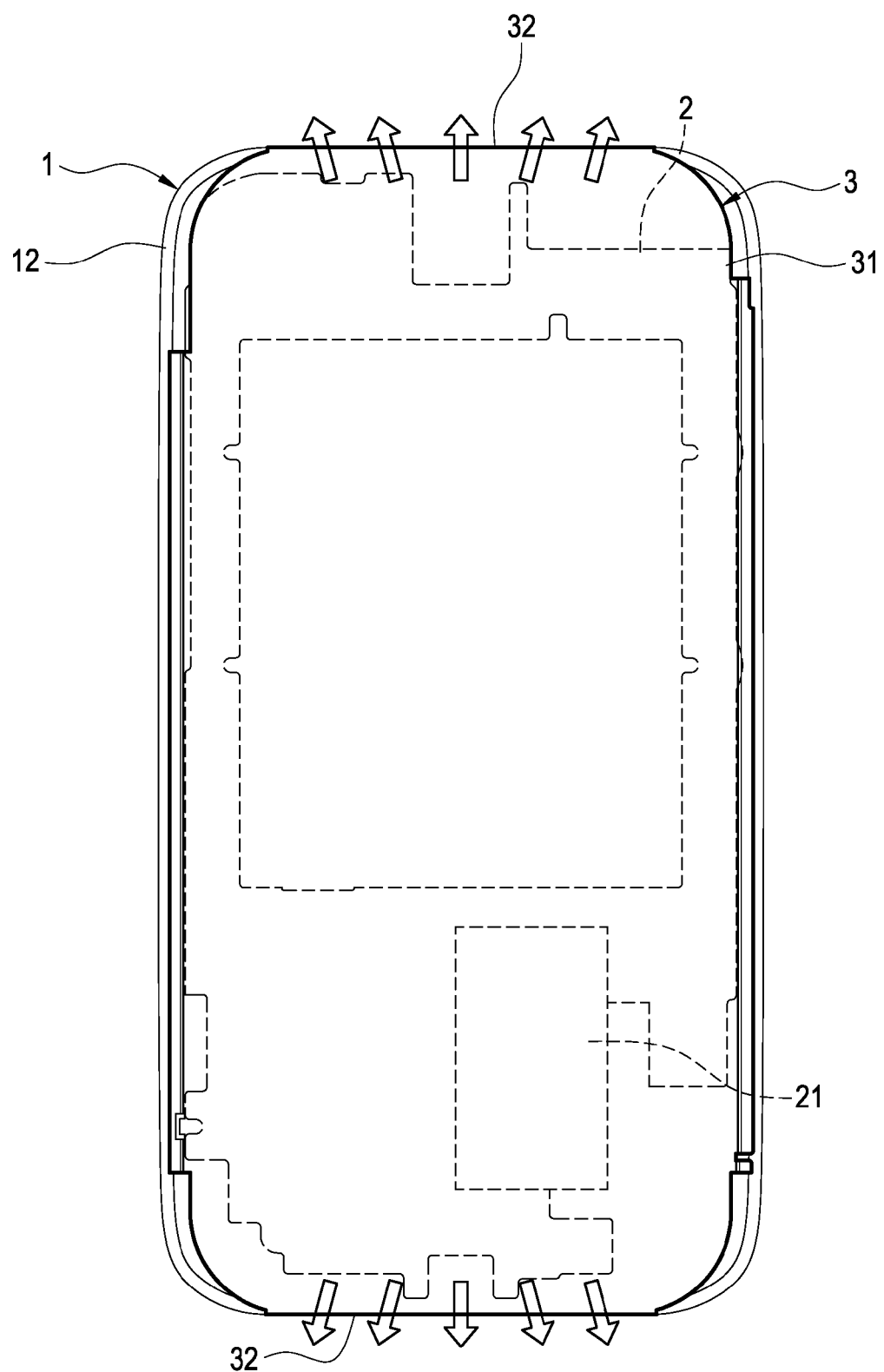
FIG. 4 is an illustration showing the heat dissipation during an operation of the present invention.

Please refer to FIG. 4 along with FIGS. 1~3. The heat dissipating plate 3 comprises a main body 31 and at least one cooling portion 32. In this embodiment, two cooling portions 32 are used for the illustration of the present invention, and the heat dissipating plate 3 is a structural member having the cooling portions 32 extended on two sides. It can be understood that there may be a plurality of cooling portions 32; for example, there may be four cooling portions such that the heat dissipating plate 3 is a structural member with the cooling portions extended on four sides. Therefore, the present invention is not limited to any configuration of the shape and quantity of the cooling portions 32 and the heat dissipating plate 3.

According to one embodiment of the present invention, the main body 31 is provided inside the receiving space 13 and is configured to stack on top of the circuit board 2 or vice versa, as shown in the figure, in order to allow the heat generating unit 21 (either one or more different types of such heat generating units of electronic components) to thermally connect to the main body 31 and such that the heat generated by the heat dissipating unit 21 can be transferred to the main body 31 by conduction.

Accordingly, the two cooling portions 32 extend from two portions of the main body 31 out to the housing 1; in this embodiment, the two cooling portions 32 are exposed on the housing 1 via the two cut-out portions 14 in order to dissipate the heat directly transferred from the main body 31, which means that the exposed cooling portions 32 are able to dissipate the heat to the outer environment directly without further heat conduction to the housing 1, such that the configuration of the exposed heat dissipating mechanism of the present invention is able to enhance the effectiveness of heat dissipation. Certainly, in addition to the use of the aforementioned two cooling portions 32 for dissipating the heat to the outer environment, the present invention may also use the main body 31 to conduct the heat further to the housing 1 in order to collaboratively utilize the basic heat dissipation capability of the housing 1 for heat dissipation of the present invention.

Furthermore, the exposed cooling portions 32 on the housing 1 may too be formed as parts of the housing 1, as shown in the figure, in order to create a unique and thorough outer appearance with beauty for the portable electronic device of the present invention. Moreover, the cooling portions 32 may too be formed to act as parts of the housing such that they can be used to shield the aforementioned cut-out portions 14. As for the heat dissipating plate 3, it may be an integrally formed structure such that the cooling portions 32 are extended from the main body 31 integrally as shown in figure; alternatively, the heat dissipating plate 3 may also be of a detachable attachment structure such that the cooling portions 32 are individually attached to extend from the main body 31 (not shown in the figure). Therefore, the present invention is not limited to any configuration and type of the cooling portions and heat dissipating plate 3.

In general, the two cooling portions 32 may be configured to be any shape and form of cooling portions as long as they are capable of achieve the effective of heat dissipation or cooling, and the present invention is not limited to any particular shape and form of cooling portions. To be more specifically, in this embodiment, the two cooling portions 32 are two bending slats extended from two opposite edges of the main body 31; wherein the bending slats can have such as an L-shaped bending, a U-shaped bending or a rectangular bending while the embodiment of the L-shaped bending slats are used for illustration of the present invention. In addition, the aforementioned two cut-out portions 14 are arranged on two sides of the housing 1, such as the upper side and the lower side of the housing 1 as shown in the figure, and the two cooling portions 32 are exposed on the upper side and the lower side of the housing 1 correspondingly. The length of the two cooling portions 32 are, preferably, close to the length of the upper side or the lower side in order to have a maximized length to satisfy the required area for heat dissipation; furthermore, the L-shaped bending thereof also significantly increases its area for heat dissipation.

According to the aforementioned exemplary embodiments of the present invention, the present invention includes at least the following technical effects and merits over the prior arts. By providing the cooling portions 32 to extend from the main body 31 and to be exposed on the housing 1, the heat generated by the heat generating unit 21 and further conducted to the main body 31 can be effectively dissipated via the exposed cooling portions 32 directly to the outer environment without the heat conduction to the housing 1, which is the primary advantage of the exposed heat dissipating mechanism of the present invention; therefore, as a result, the effectiveness of the heat dissipation can be enhanced without increasing the thickness of the portable electronic device and such that the need for greater heat dissipation in modern portable electronic devices of higher performance and computing power can be achieved. Furthermore, the temperature of the internal environment of the portable electronic device can be maintained at a suitable range without overheating the components, which may unfavorably cause the slowdown of the operation or shutdown of the device; therefore, the shortening of the useful lives of or damages on the electronic components can be prevented.

In view of the above, the actuator with a position detection mechanism of the present invention is able to achieve the objectives expected and to overcome the drawbacks of known arts, which is of novelty and inventive step to comply with the requirements of patentability and is applied legitimately for the grant of the patent right.

What is claimed is:

1. A portable electronic device with an exposed heat dissipating mechanism comprising:
   a housing having a heat generating unit arranged therein; and
   a heat dissipating plate comprising a main body arranged at the internal of the housing and a plurality of cooling portion each extended from the main body and exposed to an outer of the housing; wherein the main body and the heat generating unit are thermally connected to each other, and the main body comprises two sides with each side having one of the cooling portions extended therefrom.

2. The portable electronic device with an exposed heat dissipating mechanism according to claim 1, wherein the cooling portions are integrally formed with the main body to extend therefrom.

3. The portable electronic device with an exposed heat dissipating mechanism according to claim 1, wherein the cooling portions are attached to the main body to extend therefrom.

4. The portable electronic device with an exposed heat dissipating mechanism according to claim 1, wherein the cooling portions are a plurality of bending slats extended from an edge of the main body.

5. The portable electronic device with an exposed heat dissipating mechanism according to claim 1, wherein the cooling portions are exposed on the housing and formed to be a part of the housing.

6. The portable electronic device with an exposed heat dissipating mechanism according to claim 1, wherein the housing includes a plurality of cut-out portion, and the cooling portions are exposed on the housing via the cut-out portions, respectively.

7. The portable electronic device with an exposed heat dissipating mechanism according to claim 1, wherein the housing further comprises an upper housing member and a lower housing member, and a receiving space provided for receiving the heat dissipating plate is formed between the upper housing member and the lower housing member.

8. A portable electronic device with an exposed heat dissipating mechanism comprising:
   a housing having a heat generating unit arranged therein; and
   a heat dissipating plate comprising a main body arranged at the internal of the housing and a plurality of cooling portions each extended from the main body and exposed to an outer of the housing; wherein the main body and the heat generating unit are thermally connected to each other, and the main body comprises four sides with each side having one of the cooling portions extended thereon.

9. The portable electronic device with an exposed heat dissipating mechanism according to claim 8, wherein the cooling portions are integrally formed with the main body to extend therefrom.

10. The portable electronic device with an exposed heat dissipating mechanism according to claim 8, wherein the cooling portion are attached to the main body to extend therefrom.

11. The portable electronic device with an exposed heat dissipating mechanism according to claim 8, wherein the cooling portions are a plurality of bending slats extended from an edge of the main body.

12. The portable electronic device with an exposed heat dissipating mechanism according to claim 8, wherein the cooling portions are exposed on the housing and formed to be parts of the housing.

13. The portable electronic device with an exposed heat dissipating mechanism according to claim 8, wherein the housing includes a plurality of cut-out portions, and the cooling portions are exposed on the housing via the cut-out portions, respectively.

14. The portable electronic device with an exposed heat dissipating mechanism according to claim 8, wherein the housing further comprises an upper housing member and a lower housing member, and a receiving space provided for receiving the heat dissipating plate is formed between the upper housing member and the lower housing member.

\* \* \* \* \*